(12) United States Patent
Knight et al.

(10) Patent No.: US 7,150,109 B2
(45) Date of Patent: Dec. 19, 2006

(54) DRY-WET THERMAL MANAGEMENT SYSTEM (75) Inventors: Paul A. Knight, Spokane, WA (US); Carl Axel Ingemar Kabrell, Newman Lake, WA (US)

(73) Assignee: Isothermal Systems Research, Inc., Clarkston, WA (US)

(*) Notice: Subject to any disclaimer, the term of this patent is extended or adjusted under 35 U.S.C. 154(b) by 12 days.

(21) Appl. No.: 10/648,774

(22) Filed: Aug. 25, 2003

(65) Prior Publication Data

US 2005/0138833 A1 Jun. 30, 2005

(51) Int. Cl.
F26B 19/00 (2006.01)
H02B 1/56 (2006.01)
H05K 7/20 (2006.01)

(52) U.S. Cl. .............. 34/62; 34/66; 34/209; 454/184; 361/678; 361/690; 361/695; 361/698

(58) Field of Classification Search ................ 34/428, 34/62, 66, 209; 361/676, 677, 678, 688–691, 361/695, 698–699; 454/184
See application file for complete search history.

(56) References Cited

U.S. PATENT DOCUMENTS

| | | | | |
|---|---|---|---|---|
| 3,317,798 A | * | 5/1967 | Chu et al. | 361/696 |
| 3,406,244 A | | 10/1968 | Oktay | 174/15 |
| 4,399,484 A | | 8/1983 | Mayer | 361/382 |
| 4,493,010 A | | 1/1985 | Morrison et al. | 361/385 |
| 4,912,600 A | | 3/1990 | Jaeger et al. | 361/385 |
| 4,967,829 A | | 11/1990 | Albers et al. | 165/1 |
| 5,057,968 A | | 10/1991 | Morrison | 361/385 |
| 5,177,666 A | | 1/1993 | Bland et al. | 361/382 |
| 5,181,648 A | * | 1/1993 | Leicht | 228/201 |
| 5,220,804 A | | 6/1993 | Tilton et al. | 62/64 |
| 5,293,754 A | | 3/1994 | Mizuno | 62/185 |
| 5,675,473 A | | 10/1997 | McDunn et al. | 361/699 |
| 5,718,117 A | | 2/1998 | McDunn et al. | 62/64 |
| 5,740,018 A | | 4/1998 | Rumbut, Jr. | 361/720 |
| 5,831,824 A | | 11/1998 | McDunn et al. | 361/699 |

(Continued)

FOREIGN PATENT DOCUMENTS

EP 0 091 733 10/1983

(Continued)

OTHER PUBLICATIONS

High-Performance COTS DSP for Harsh Environment VME Electronics, Tilton, Donald E. et al., COTS Journal, May/Jun. 1999.

(Continued)

*Primary Examiner*—Jiping Lu
(74) *Attorney, Agent, or Firm*—Michael S. Neustel (57) ABSTRACT

A dry-wet thermal management system for providing simultaneous spray cooling and dry cooling for a plurality of cards. The dry-wet thermal management system includes a chassis having a dry chamber and a spray chamber, a first opening within a rear portion of the chassis extending into the spray chamber, a second opening within the rear portion of the chassis extending into the dry chamber, and a main backplane secured and sealed to the rear portion of the chassis. Electronic cards may be electrically coupled within sockets of the main backplane within both the dry chamber and the spray chamber. The cards within the spray chamber are typically high heat flux components with increased cooling requirements and the cards within the dry chamber are typically low heat flux components with reduced cooling requirements. A spray cool system is within the spray chamber and a dry cool system is within the dry chamber.

16 Claims, 9 Drawing Sheets

U.S. PATENT DOCUMENTS

| | | | |
|---|---|---|---|
| 5,854,092 A | 12/1998 | Root et al. | 438/106 |
| 5,880,931 A | 3/1999 | Tilton et al. | 361/690 |
| 5,907,473 A | 5/1999 | Przilas et al. | 361/699 |
| 5,943,211 A * | 8/1999 | Havey et al. | 361/699 |
| 5,999,404 A | 12/1999 | Hileman | 361/699 |
| 6,055,157 A | 4/2000 | Bartilson | 361/699 |
| 6,108,201 A | 8/2000 | Tilton et al. | 361/689 |
| 6,139,361 A | 10/2000 | Przilas et al. | 439/559 |
| 6,349,554 B1 | 2/2002 | Patel et al. | 62/259.2 |
| 6,392,891 B1 | 5/2002 | Tzlil et al. | 361/719 |
| 6,421,240 B1 | 7/2002 | Patel | 361/699 |
| 6,496,375 B1 | 12/2002 | Patel et al. | 361/719 |
| 6,597,569 B1 | 7/2003 | Unrein | 361/687 |
| 6,604,370 B1 | 8/2003 | Bash et al. | 62/171 |
| 6,621,707 B1 | 9/2003 | Ishimine et al. | 361/721 |
| 6,625,023 B1 | 9/2003 | Morrow et al. | 361/700 |
| 6,646,879 B1 | 11/2003 | Pautsch | 361/699 |

FOREIGN PATENT DOCUMENTS

| | | | |
|---|---|---|---|
| EP | 0297308 A2 * | 1/1989 | 361/695 |
| JP | 56133544 A * | 10/1981 | |
| JP | 61-267369 | 11/1986 | |
| JP | 2-24531 | 1/1990 | |
| WO | WO 01/01741 | 1/2001 | |

OTHER PUBLICATIONS

Mist Cooling for Harsh Environment VME, Tilton, Donald E. et al., RTC Magazine, May 1999.

Applying Mist to COTS Convection Modules Is Really Cool, Tilton, Charles, COTS View, 2000.

Spray Cooling for the 3-D Cube Computer, Tilton, Donald E. et al., InterSociety Conference, May 1994.

Spray Cooling Electrical and Electronic Equipment, Tilton, COTS Journal, Nov. 2003.

Parker Advanced Liquid Cooling Systems Team, Parker Aerospace, May 13, 2003.

* cited by examiner

DRY-WET THERMAL MANAGEMENT SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to spray cool thermal management devices and more specifically it relates to a dry-wet thermal management system for providing simultaneous spray cooling and dry cooling for a plurality of electronic cards.

2. Description of the Related Art

The present invention relates to the thermal management of electronic components that are mounted upon electronic cards (a.k.a. expansion boards) or substrates. In a card level system, a plurality of cards are electrically connected within sockets upon a backplane (e.g. motherboard, etc.). Electronic cards are utilized in various applications such as personal computers, workstations, server computers, rack mounted services, network routers, network switches, telephone equipment (DWDMs, ADMs, TDMs, switches, repeaters and the like), and military applications (vehicle, aircraft, etc.). Examples of electronic cards include but are not limited to modems, video processors, network interfaces, processors, memory, hard drive controllers, hard drives, mouse controller, keyboard controller, global position systems, wireless cards, backplane controller cards and the like.

"Dry cooling" (i.e. air cooling) has been in usage for years for cooling electronic components. An example of a dry cooling system is a conventional desktop computer with a fan that passes air over the electronic components to cool the same. Dry cooling technology is acceptable for low powered electronic components.

Modern electronic devices have increased thermal management requirements. Conventional dry cooling technology simply is not capable of efficiently cooling modern high-end electronics. "Spray cooling" is being adopted today as the most efficient option for thermally managing electronic systems. U.S. Pat. No. 5,220,804 entitled High Heat Flux Evaporative Spray Cooling to Tilton et al. describes the earlier versions of spray cooling technology. U.S. Pat. No. 6,108,201 entitled Fluid Control Apparatus and Method for Spray Cooling to Tilton et al. also describes the usage of spray cooling technology to cool a printed circuit board. Spray cooling may be performed locally (i.e. where the chip is sprayed directly), globally (i.e. where the chip and surrounding electronics/boards are also sprayed), a combination of locally and globally, or in conjunction with air cooling or other cooling methods.

While there are many benefits in utilizing spray cooling technology, there are some detriments. One of the detriments with spray cooling technology is the relatively high cost of creating a spray cooling system capable of thermally managing all of the electronic devices, electronic cards and the like for an electronic system. Another problem with spray cooling technology is the increased weight of the thermal management unit. A further problem with spray cooling technology is that not all electronic devices are suitable for usage within a liquid coolant environment. Another problem with spray cooling technology is that to replace, repair or test any electronic device within a spray chassis the seal must be broken to the spray chassis thereby leading to the loss of coolant.

While these devices may be suitable for the particular purpose to which they address, they are not as suitable for providing simultaneous spray cooling and dry cooling for a plurality of cards sharing a common backplane. Conventional thermal management systems are suitable only for low or high heat flux applications with no thermal management system serving the need for mixed heat flux applications where some electronic devices may be cooled by dry cooling and other electronic devices cooled by spray cooling.

In these respects, the dry-wet thermal management system according to the present invention substantially departs from the conventional concepts and designs of the prior art, and in so doing provides an apparatus primarily developed for the purpose of providing simultaneous spray cooling and dry cooling for a plurality of cards sharing a common backplane.

BRIEF SUMMARY OF THE INVENTION

In view of the foregoing disadvantages inherent in the known types of thermal management devices now present in the prior art, the present invention provides a new dry-wet thermal management system construction wherein the same can be utilized for providing simultaneous spray cooling and dry cooling for a plurality of cards sharing a common backplane.

The general purpose of the present invention, which will be described subsequently in greater detail, is to provide a new dry-wet thermal management system that has many of the advantages of the thermal management devices mentioned heretofore and many novel features that result in a new dry-wet thermal management system which is not anticipated, rendered obvious, suggested, or even implied by any of the prior art thermal management devices, either alone or in any combination thereof.

To attain this, the present invention generally comprises a chassis having a dry chamber and a spray chamber, a first opening within a rear portion of the chassis extending into the spray chamber, a second opening within the rear portion of the chassis extending into the dry chamber, and a main backplane secured and sealed to the rear portion of the chassis. Electronic cards may be electrically coupled within sockets of the main backplane within both the dry chamber and the spray chamber. The cards within the spray chamber are typically high heat flux components with increased cooling requirements and the cards within the dry chamber are typically low heat flux components with reduced cooling requirements. In addition, cards within the dry chamber are sometimes not compatible with the cooling fluid of the spray chamber. A spray cool system is within the spray chamber and a dry cool system is within the dry chamber.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a dry-wet thermal management system that will overcome the shortcomings of the prior art devices.

A second object is to provide a dry-wet thermal management system for providing simultaneous spray cooling and dry cooling for a plurality of cards sharing a common backplane.

Another object is to provide a dry-wet thermal management system that is cost effective and efficient.

An additional object is to provide a dry-wet thermal management system that has a reduce weight and size.

A further object is to provide a dry-wet thermal management system that reduces the cost of electronic devices utilized by reducing the need for coolant tolerant specifications.

Another object is to provide a dry-wet thermal management system that reduces coolant loss within a spray cooling system by reducing access to the spray chamber.

A further object is to provide a dry-wet thermal management system that effectively cools low heat flux and high heat flux electronic components.

Another object is to provide a dry-wet thermal management system that utilizes a common backplane for electronic cards positioned within a dry chamber and a spray chamber.

An additional object is to provide a dry-wet thermal management system that increases system reliability and access.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Turning now descriptively to the drawings, in which similar reference characters denote similar elements throughout the several views, FIGS. 2 through 9 illustrate a dry-wet thermal management system 10, which comprises a chassis 20 having a dry chamber 28 and a spray chamber 26, a first opening 22 within a rear portion 21 of the chassis 20 extending into the spray chamber 26, a second opening 24 within the rear portion 21 of the chassis 20 extending into the dry chamber 28, and a main backplane 40 secured and sealed to the rear portion 21 of the chassis 20. Electronic cards 12 may be electrically coupled within sockets 42 of the main backplane 40 within both the dry chamber 28 and the spray chamber 26. The cards 12 within the spray chamber 26 are typically high heat flux components with increased cooling requirements and the cards 12 within the dry chamber 28 are typically low heat flux components with reduced cooling requirements and/or are not compatible with the cooling fluid of spray chamber 26. A spray cool system is within the spray chamber 26 and a dry cool system is within the dry chamber 28.

B. Chassis (Dry Chamber and Wet Chamber)

As shown in FIGS. 2 through 9 of the drawings, the chassis 20 may have various shapes, structures and configurations. The chassis 20 illustrated in the drawings should not be interpreted to limit the scope of protection of the present invention. Chassis 20 may be freestanding or mounted into a rigid structure, such as but not limited to a network rack.

Figure 2:
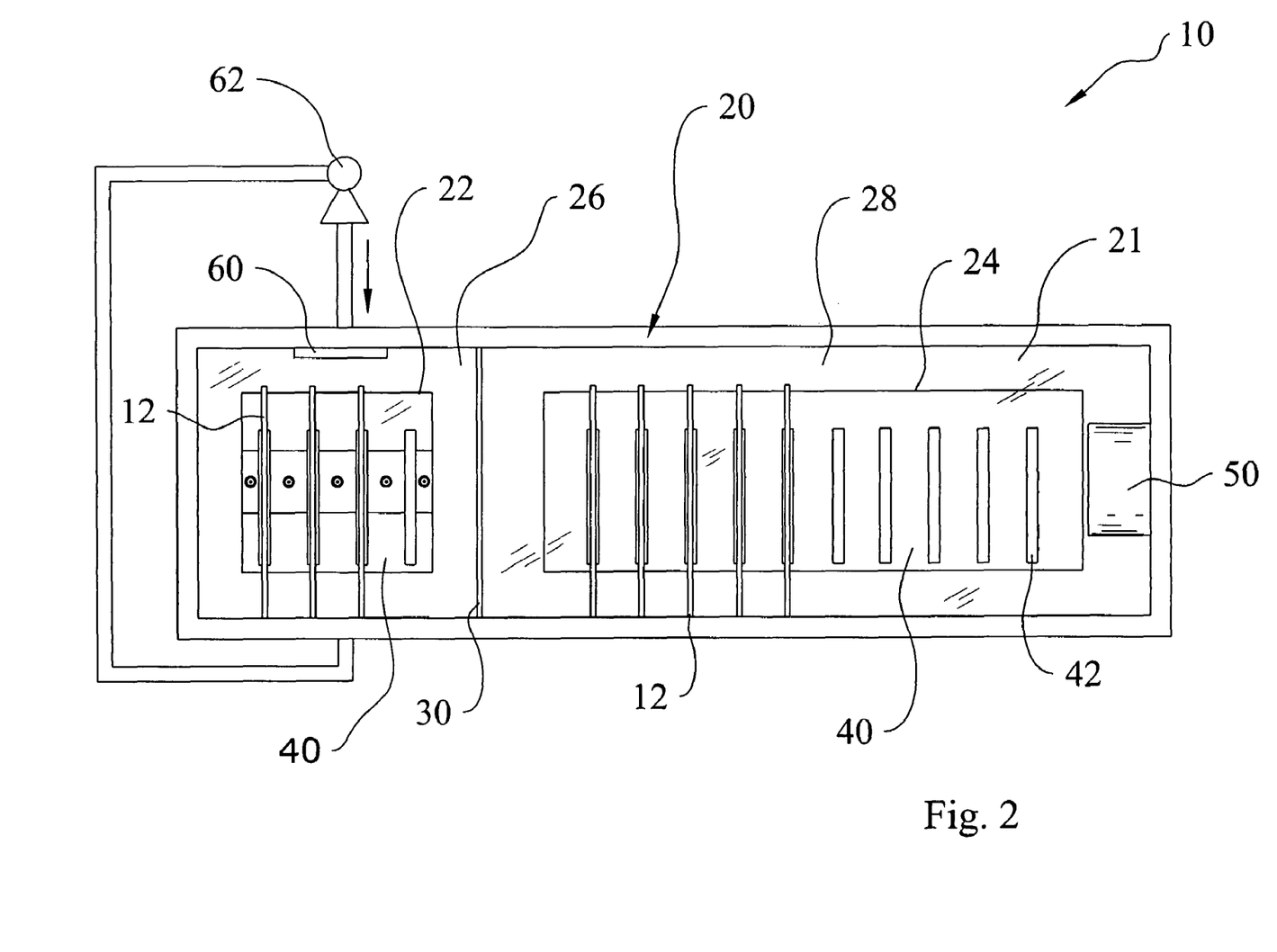
FIG. 2 is a front view of the present invention illustrating the spray chamber and the dry chamber.
Figure 3:
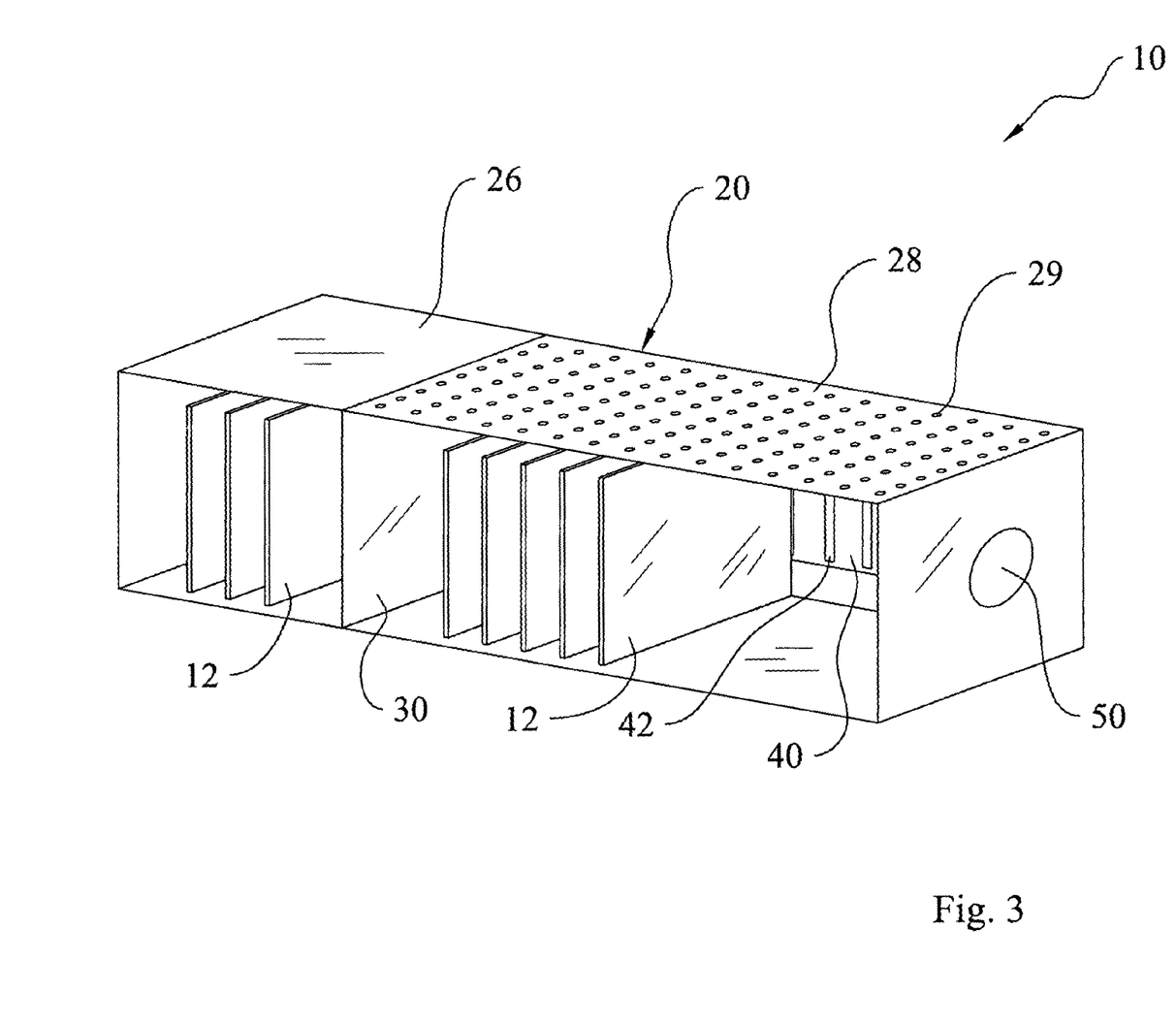
FIG. 3 is a front perspective view of the present invention.
Figure 4:
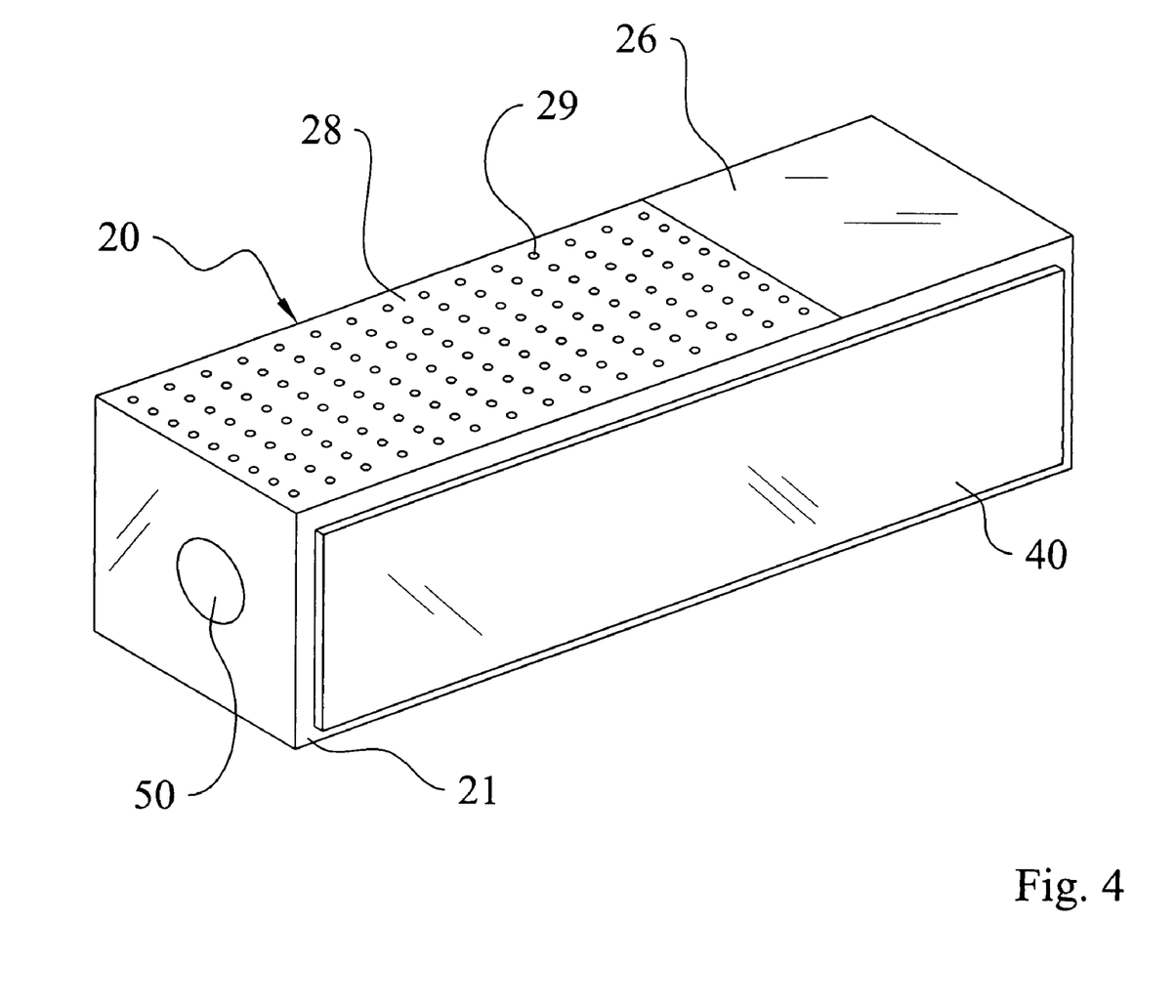
FIG. 4 is a rear perspective view of the present invention illustrating the common backplane.

More particularly, the chassis 20 has at least one dry chamber 28 and at least one spray chamber 26. The dry chamber 28 and the spray chamber 26 may be separated within the chassis 20 by a solid divider wall 30 as shown in FIGS. 2 and 3 of the drawings.

The dry chamber 28 and the spray chamber 26 also are preferably enclosed by access doors/panels (not shown) as is well known in the art. The access door/panel connected to the spray chamber 26 preferably is sealed to the spray chamber 26 to prevent coolant loss. It can be appreciated that the access doors/panels for the spray chamber 26 and the dry chamber 28 may be connected to one another or comprised of a single structure.

Figure 7:
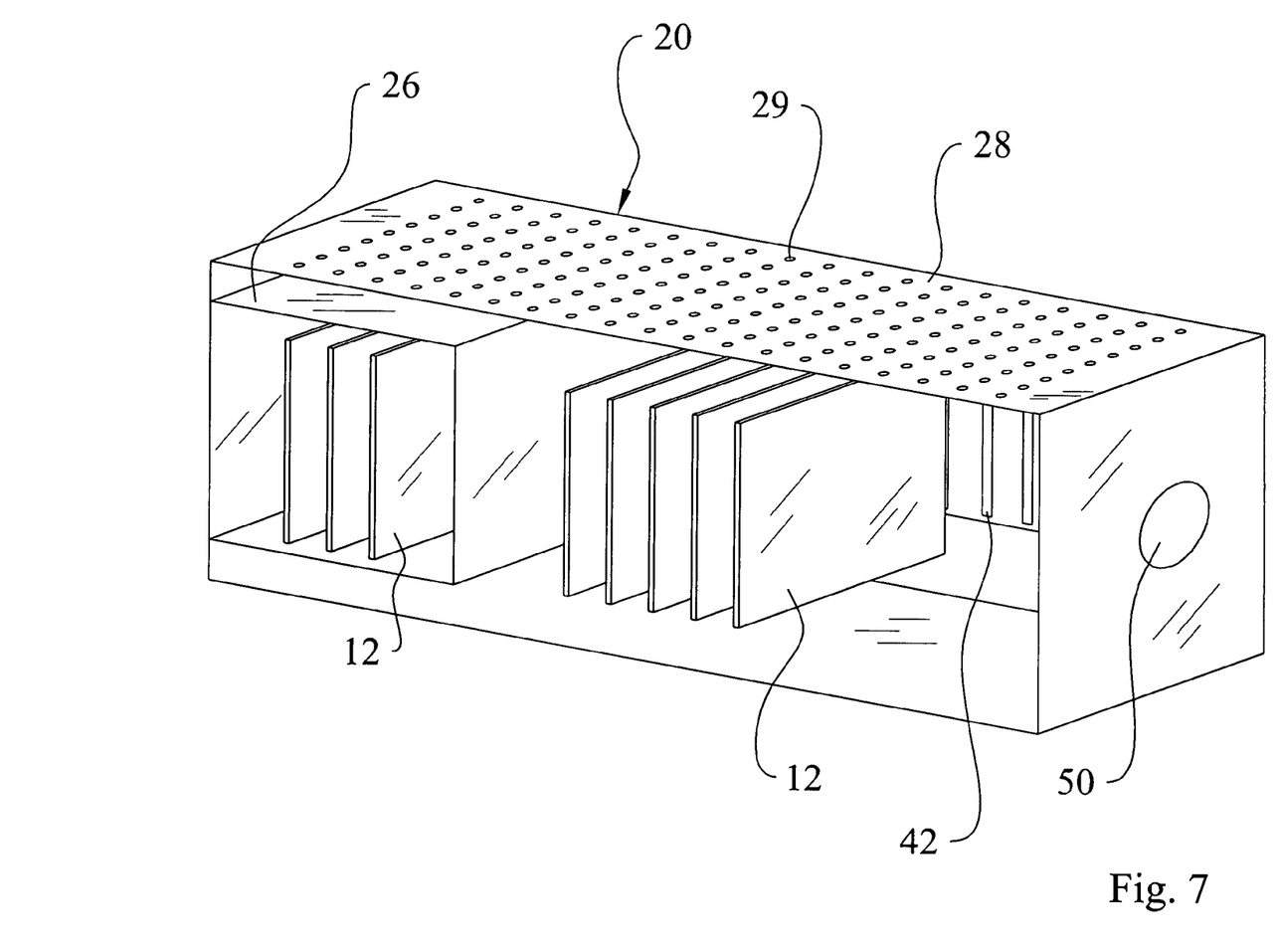
FIG. 7 is a front perspective view illustrating an alternative variation of the spray chamber.
Figure 8:
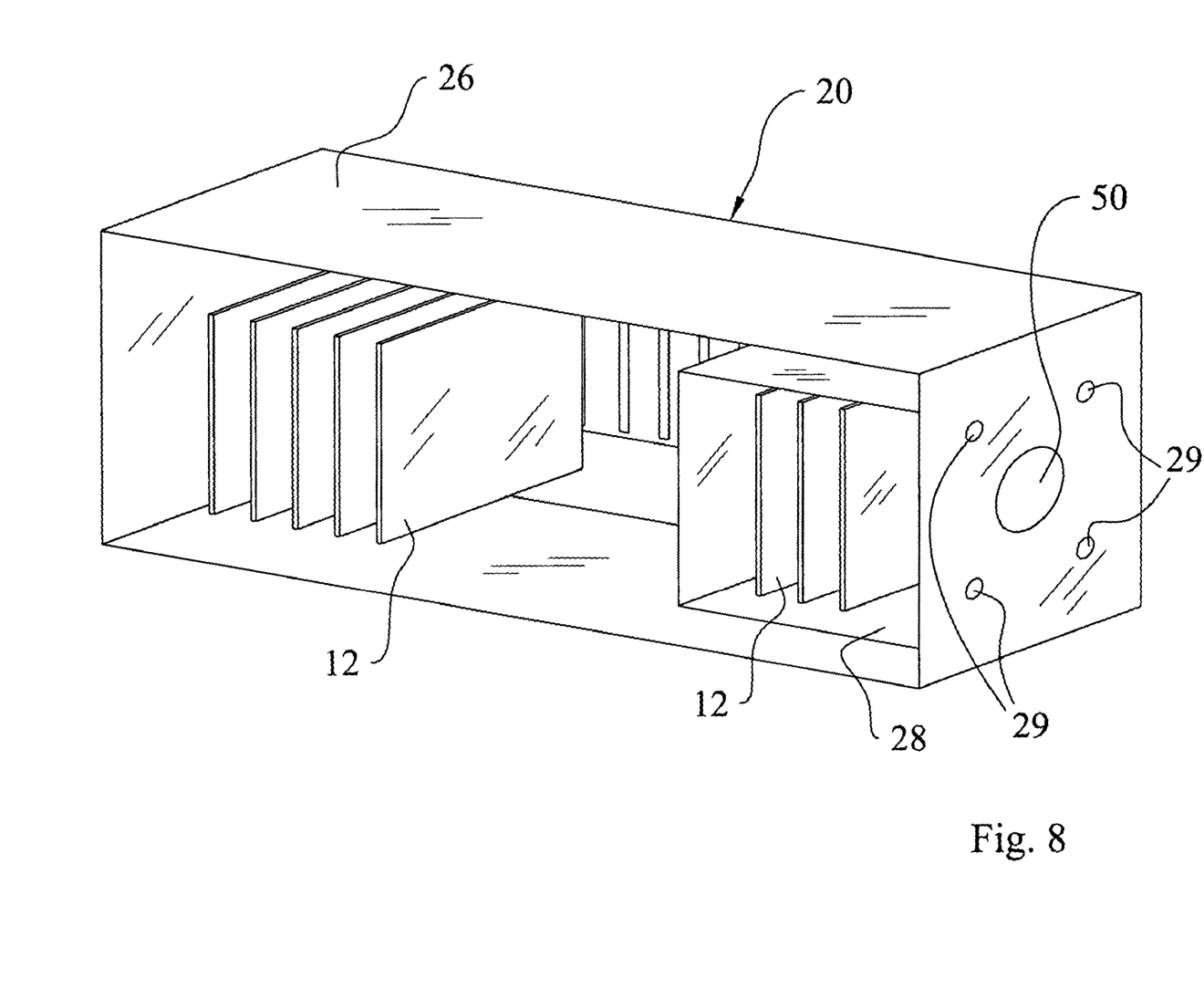
FIG. 8 is a front perspective view illustrating an alternative variation of the dry chamber.
Figure 9:
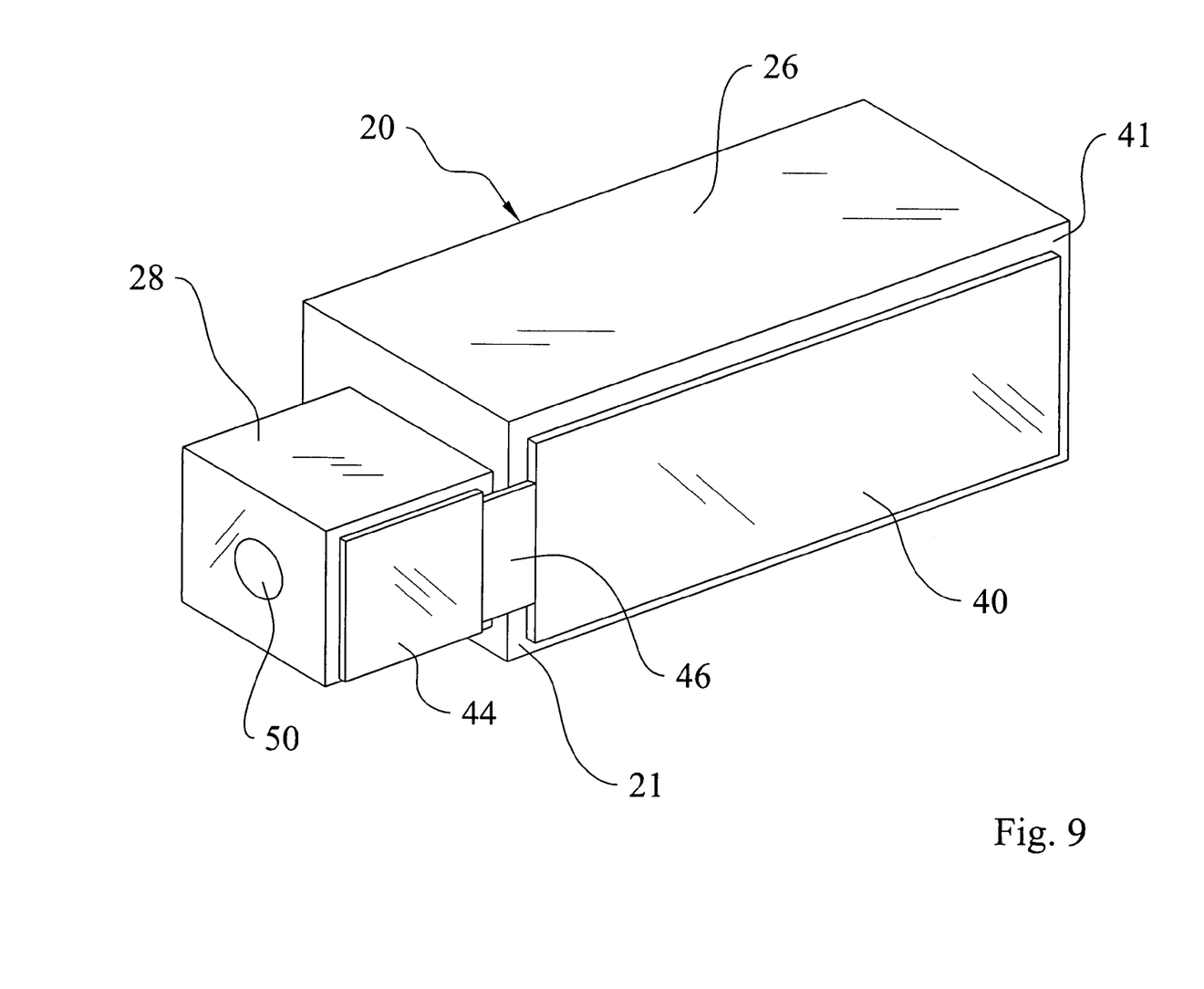
FIG. 9 is a rear perspective view of an alternative variation of the dry chamber.

The dry chamber 28 and the spray chamber 26 may be positioned within an overall structure as separate compartments (see FIGS. 7 and 8) or attached to one another (see FIG. 9). FIG. 7 illustrates the dry chamber 28 completely or partially surrounding the spray chamber 26. FIG. 8 illustrates the spray chamber 26 completely or partially surrounding the dry chamber 28. FIG. 9 illustrates a dry chamber 28 attached to the spray chamber 26 utilizing conventional fasteners thereby allowing "swapping" of the dry chamber 28 or the spray chamber 26 with a new chamber 26, 28.

The dry chamber 28 is designed to allow for airflow to pass through and make contact with the dry cards 12 within the dry chamber 28. Various well-known dry cooling technologies may be utilized to pass air through the dry chamber 28. For example, a fan 50 may be fluidly connected to the dry chamber 28 as shown in FIGS. 2 through 9 of the drawings.

In addition, the dry chamber 28 preferably includes a plurality of vents 29 within the walls, floor and ceiling of the dry chamber 28 allowing for the free flow of air thereby maintaining a desired temperature of the electronic cards 12 within the dry chamber 28.

The spray chamber 26 is designed to allow for liquid coolant to contact the cards 12 thereby conducting the thermal energy generated by the wet cards 12. Various well-known liquid coolant thermal management technologies may be utilized within the spray chamber 26 for thermally managing the wet cards 12 within the spray chamber 26. The cards 12 positioned within the spray chamber 26 must be capable of being positioned within a dielectric coolant.

For example, a spray unit 60 is preferably positioned within the spray chamber 26 and fluidly connected to a pump unit 62. The pump unit 62 fluidly receives used coolant from within the spray chamber 26 and preferably thermally conditions the coolant through a heat exchanger prior to transmission to the spray unit 60. U.S. Pat. Nos. 5,220,804 and 6,108,201 illustrate spray cooling technology that may be utilized within the present invention and are hereby incorporated by reference into this application.

The spray chamber 26 is designed to receive at least one electronics card 12 capable of being spray cooled. The "wet cards" 12 are preferably high heat flux cards 12 that generate a significant amount of heat during operation thereof.

The dry chamber 28 is designed to receive at least one electronics card 12 capable of being dry/air cooled. The "dry cards" 12 are preferably low-medium heat flux cards 12 that generate relatively lower amounts of heat during operation thereof compared to the wet cards 12. Dry cards 12 are generally less expensive because they do not require operation within a liquid coolant.

C. Main Backplane

Figure 5:
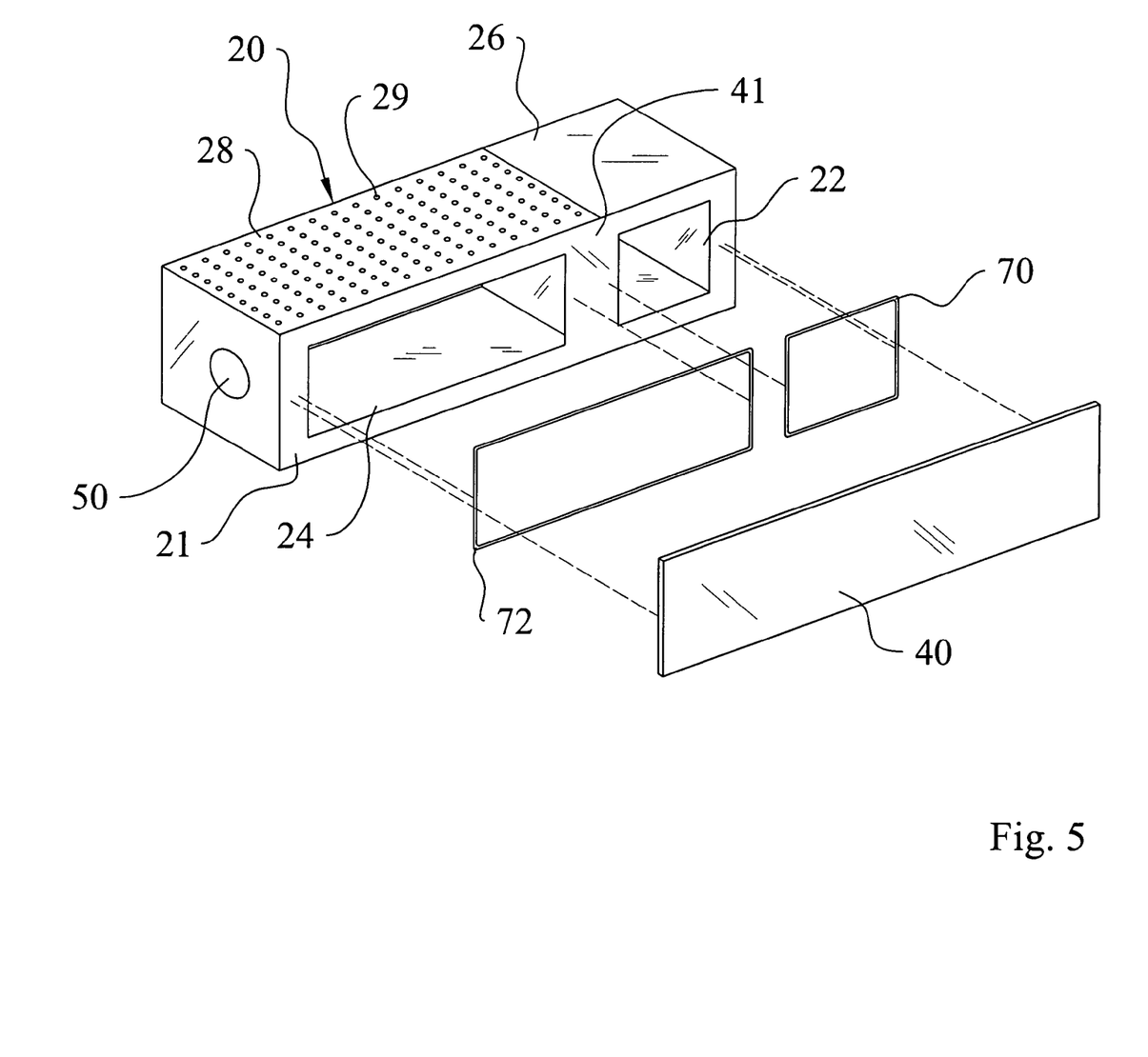
FIG. 5 is an exploded rear perspective view of the present invention illustrating the seals

As shown in FIGS. 2 and 5 of the drawings, a first opening 22 is positioned within a rear portion 21 of the chassis 20 extending into the spray chamber 26. As further shown in FIGS. 2 and 5 of the drawings, a second opening 24 is positioned within the rear portion 21 of the chassis 20 extending into the dry chamber 28.

The first opening 22 and the second opening 24 may have various shapes, sizes and locations within the chassis 20. However, the first opening 22 and the second opening 24 are preferably sized sufficiently to accommodate the sockets 42 attached to the main backplane 40 and/or the secondary backplane 44 as best illustrated in FIG. 2 of the drawings.

The main backplane 40 is attached to the rear portion 21 of the chassis 20 by various attachment means such as fasteners, adhesive, sealants, brackets, clamps and the like. The main backplane 40 is preferably sealed about the first opening 22 and the second opening 24 to prevent coolant from escaping from the spray chamber 26. It can be appreciated that only the spray chamber 26 may be sealed by the main backplane 40 since airflow through the second opening 24 will not interfere with the thermal management of the dry cards 12.

The main backplane 40 has at least one dry socket extending into the dry chamber 28 and at least one wet socket extending into the spray chamber 26 as shown in FIG. 2 of the drawings. The sockets 42 may be comprised of any electronic receptacle capable of electrically receiving a card 12.

E. Seal

As shown in FIG. 5 of the drawings, at least one seal is positioned between the rear portion 21 of the chassis 20 and the main backplane 40 for sealing about the first opening 22 and the second opening 24. The seal may be comprised of a single structure or a plurality of seal structures.

FIG. 5 illustrates a first seal 70 surrounding the first opening 22 and a second seal 72 surrounding the second opening 24. The first seal 70 and the second seal 72 may be comprised of various structures and materials commonly utilized to construct seals. It can be appreciated that only the first seal 70 is required to operate the present invention by sealing the spray chamber 26. The seal 70, 72 may also be formed utilizing various other materials/structures such as but not limited to sealants, resins, adhesives, gaskets, 0-rings and the like.

F. Secondary Backplane

Figure 6:
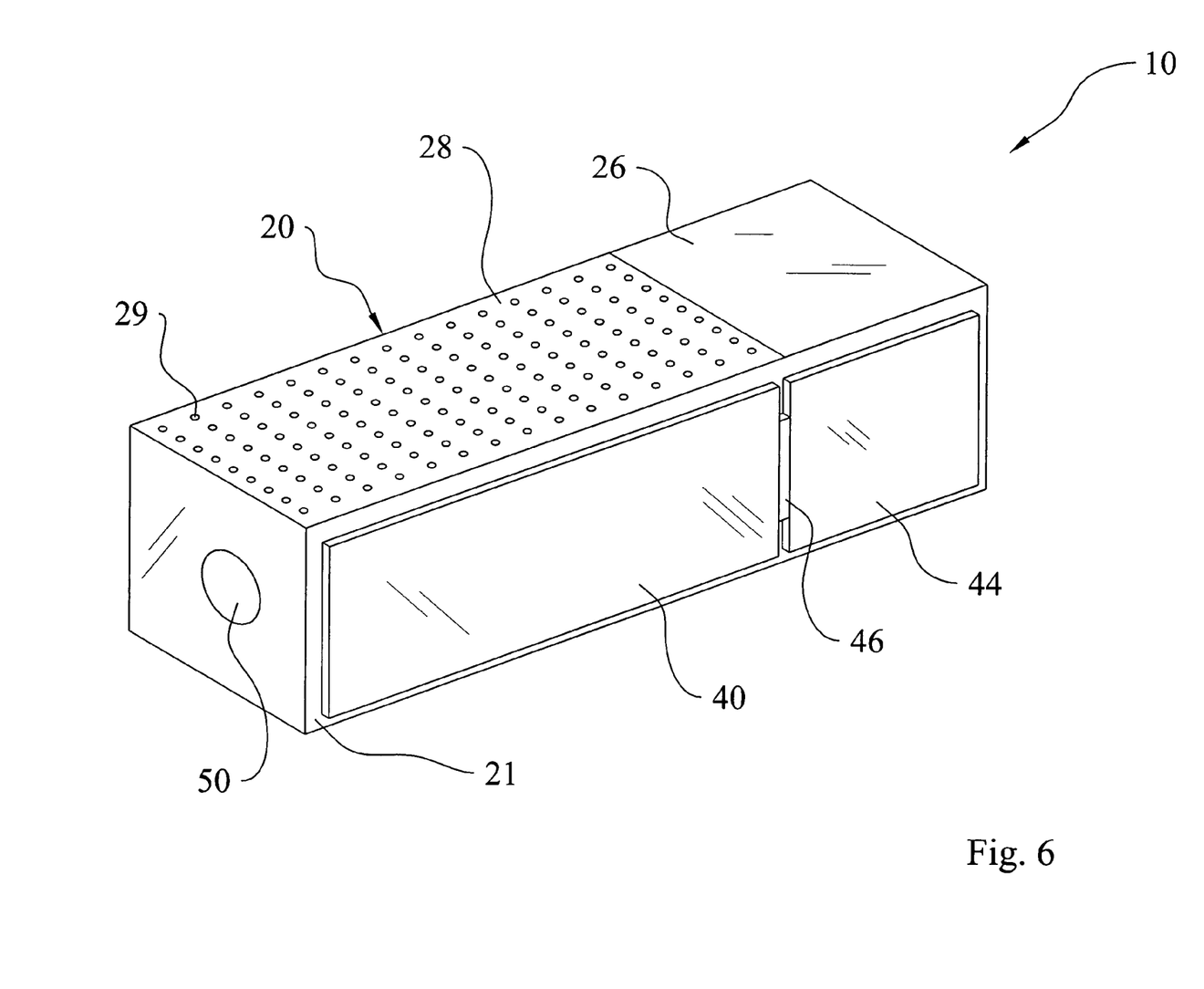
FIG. 6 is a rear perspective view of the present invention utilizing a secondary backplane connected to the main backplane.

In addition to a main backplane 40, a secondary backplane 44 may be attached and electrically connected to the main backplane 40 as shown in FIGS. 6 and 9 of the drawings. The main backplane 40 has at lease one dry socket extending into the dry chamber 28 and the secondary backplane 44 has at least one wet socket extending into the spray chamber 26.

A connector member 46 is electrically positioned between the main backplane 40 and the secondary backplane 44 as further shown in FIGS. 6 and 9 of the drawings. The secondary backplane 44 and the main backplane 40 are preferably sealed to the rear portion 21 of the chassis 20 about the first opening 22 and the second opening 24 respectively.

G. Operation

Figure 1:
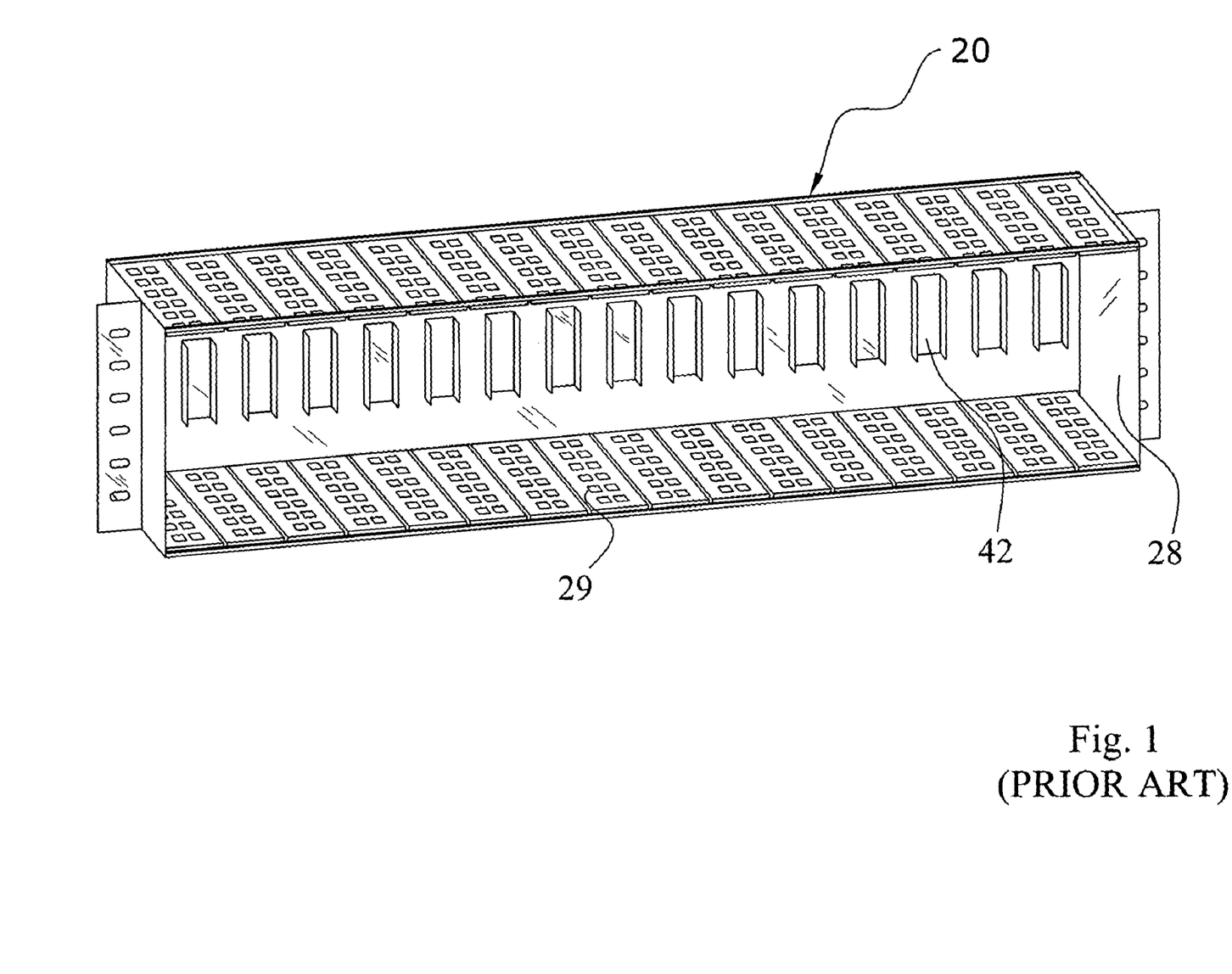
FIG. 1 is an upper perspective view of a prior art dry cooling device.

In operation of the present invention, at least one high heat flux card 12 is positioned within the wet chamber and electrically connected within one of the sockets 42 attached to the main backplane 40 as shown in FIG. 1 of the drawings. The spray chamber 26 is then sealed. In addition, at least one low heat flux card 12 is positioned within the dry chamber 28 and electrically connected within one of the sockets 42 attached to the main backplane 40 as shown in FIG. 1 of the drawings. An access door/panel may then be closed upon the dry chamber 28.

The electronic cards 12 may then be electrically operated as desired to perform a desired task. Before, during and/or after operation of the electronic cards 12, a liquid coolant is applied to the wet cards 12 within the spray chamber 26 for thermally managing the wet cards 12. Various sensors within the spray chamber 26 determine the coolant flow rate and coolant temperature applied to the wet cards 12 depending upon the heat flux of the wet cards 12 and the desired temperature of the wet cards 12.

In addition to operation of the spray cooling system within the spray chamber 26, airflow is applied within the dry chamber 28 for thermally managing the dry cards 12 within thereof. A fan 50 or similar air movement device may be utilized to cause air to flow through the dry chamber 28 thereby thermally managing the electronic cards 12. Various sensors within the dry chamber 28 determine the amount of airflow required to maintain a desired temperature within the dry cards 12.

If the user requires access to the cards 12 within the dry chamber 28, the access door/panel is simply removed without having to disturb the spray chamber 26. The user is then able to make the required additions/repairs within the dry chamber 28 and close the same in an efficient manner without losing any coolant. If the user requires access to the cards 12 within the spray chamber 26, the access door/panel is removed. A small volume of liquid coolant may be lost in opening the spray chamber 26, but the amount of coolant loss is less than if a larger spray chamber 26 were opened. The user is then able to make the required additions/repairs within the spray chamber 26 and close the same in an efficient manner without losing significant amounts of coolant.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A dry-wet thermal management system for providing simultaneous spray cooling and dry cooling for a plurality of electronic cards, comprising:
    a chassis having a dry chamber and a spray chamber, at least one dry electronic card positioned within said dry chamber and at least one wet electronic card positioned within said spray chamber, wherein said spray chamber is sealed;
    wherein said at least one dry electronic card is a low-medium heat flux card with reduced cooling requirements and generates relatively lower amounts of heat during operation thereof compared to said at least one wet electronic card; and
    a spray unit within said spray chamber for applying liquid coolant to said at least one wet electronic card;
    a dry cool system fluidly connected to said dry chamber for applying airflow to said at least one dry electronic card positioned in said dry chamber.

2. The dry-wet thermal management system of claim 1, wherein said dry chamber includes a fan for forcing air over said at least one dry electronic card.

3. The dry-wet thermal management system of claim 1, including:
    a first opening within a rear portion of said chassis extending into said spray chamber;
    a second opening within said rear portion of said chassis extending into said dry chamber; and
    a main backplane attached to said rear portion of said chassis, wherein said main backplane has at least one dry socket extending into said dry chamber and at least one wet socket extending into said spray chamber.

4. The dry-wet thermal management system of claim 3, wherein said main backplane is sealed to said rear portion of said chassis about said first opening and said second opening.

5. The dry-wet thermal management system of claim 4, including a seal positioned between said rear portion of said chassis and said main backplane.

6. The dry-wet thermal management system of claim 5, wherein said seal is comprised of a single structure.

7. The dry-wet thermal management system of claim 5, wherein said seal is comprised of a first seal surrounding said first opening and a second seal surrounding said second opening.

8. The dry-wet thermal management system of claim 4, including a sealant positioned between said rear portion of said chassis and said main backplane.

9. The dry-wet thermal management system of claim 1, including a spray cooling management unit fluidly connected to said spray unit and said spray chamber.

10. The dry-wet thermal management system of claim 1, including:
    a first opening within a rear portion of said chassis extending into said spray chamber;
    a second opening within said rear portion of said chassis extending into said dry chamber;
    a main backplane attached to said rear portion of said chassis, wherein said main backplane has at least one dry socket extending into said dry chamber; and
    a secondary backplane attached to said rear portion of said chassis and electrically coupled to said main backplane, wherein said secondary backplane has at least one wet socket extending into said spray chamber.

11. The dry-wet thermal management system of claim 10, including a connector member electrically positioned between said main backplane and said secondary backplane.

12. The dry-wet thermal management system of claim 10, wherein said secondary backplane and said main backplane are sealed to said rear portion of said chassis about said first opening and said second opening respectively.

13. The dry-wet thermal management system of claim 12, including a seal positioned between said rear portion of said chassis and said main backplane and said secondary backplane.

14. The dry-wet thermal management system of claim 13, wherein said seal is comprised of a single structure.

15. The dry-wet thermal management system of claim 13, wherein said seal is comprised of a first seal surrounding said first opening and a second seal surrounding said second opening.

16. The dry-wet thermal management system of claim 12, including a sealant positioned between said rear portion of said chassis and said main backplane.

* * * * *